US010551182B2

(12) United States Patent
Guan et al.

(10) Patent No.: US 10,551,182 B2
(45) Date of Patent: Feb. 4, 2020

(54) PROXIMITY SENSOR, LITHOGRAPHIC APPARATUS AND DEVICE MANUFACTURING METHOD

(71) Applicant: ASML NETHERLANDS B.V., Veldhoven (NL)

(72) Inventors: Tiannan Guan, Best (NL); Joseph Eid Estafanous Zekry, Achel (BE)

(73) Assignee: ASML NETHERLANDS B.V., Veldhoven (NL)

( * ) Notice: Subject to any disclaimer, the term of this patent is extended or adjusted under 35 U.S.C. 154(b) by 52 days.

(21) Appl. No.: 15/769,999

(22) PCT Filed: Oct. 25, 2016

(86) PCT No.: PCT/EP2016/075670
§ 371 (c)(1),
(2) Date: Apr. 20, 2018

(87) PCT Pub. No.: WO2017/080818
PCT Pub. Date: May 18, 2017

(65) Prior Publication Data
US 2019/0086202 A1 Mar. 21, 2019

(30) Foreign Application Priority Data
Nov. 10, 2015 (EP) ..................................... 15193776

(51) Int. Cl.
*G01B 13/12* (2006.01)
*G03F 9/00* (2006.01)
*G01L 11/02* (2006.01)

(52) U.S. Cl.
CPC .............. *G01B 13/12* (2013.01); *G01L 11/02* (2013.01); *G01L 11/025* (2013.01); *G03F 9/7057* (2013.01)

(58) Field of Classification Search
CPC ........ G01B 13/12; G01L 11/02; G03F 9/7057
See application file for complete search history.

(56) References Cited

U.S. PATENT DOCUMENTS 4,322,978 A * 4/1982 Fromm ................. G01L 9/0077
250/227.21
4,322,979 A * 4/1982 Fromm ................. G01L 9/0077
359/222.1
(Continued)

FOREIGN PATENT DOCUMENTS

EP 2950324 B1 * 11/2018

*Primary Examiner* — David A Rogers
(74) *Attorney, Agent, or Firm* — Arent Fox LLP (57) ABSTRACT

A gas gauge proximity sensor comprising a measurement gas flow channel having an optical pressure sensor for comparing a pressure of the first gas flow and a reference pressure; the optical pressure sensor comprising a first optical cavity fluidly connected to the measurement channel and a second optical cavity fluidly connected to the reference pressure, with the optical cavities being configured to receive electromagnetic radiation and output reflected electromagnetic radiation, the optical pressure sensor further being configured to combine the reflected electromagnetic radiation from the first optical cavity with the reflected electromagnetic radiation from the second optical cavity and determine, based on the combined electromagnetic radiation, a pressure difference between the pressure of the first gas flow and the reference pressure and determine, based on the pressure difference, a distance between the measurement outlet and the measurement object.

20 Claims, 6 Drawing Sheets

(56) References Cited

U.S. PATENT DOCUMENTS

| | | | | |
|---|---|---|---|---|
| 4,325,248 | A * | 4/1982 | Kolosov | G01D 5/44 73/37.5 |
| 4,499,373 | A * | 2/1985 | Johnston | G01L 23/16 250/231.19 |
| 4,899,046 | A | 2/1990 | Wright et al. | |
| 4,933,545 | A * | 6/1990 | Saaski | G01L 9/0079 250/227.14 |
| 4,953,388 | A * | 9/1990 | Barada | G01B 13/00 73/37.5 |
| 5,657,405 | A * | 8/1997 | Fujiwara | G01D 5/268 356/225 |
| 6,130,439 | A | 10/2000 | Le Menn | |
| 6,603,128 | B2 * | 8/2003 | Maehara | B82Y 10/00 250/441.11 |
| 6,820,489 | B2 * | 11/2004 | Fernald | G01L 11/025 73/705 |
| 6,864,953 | B2 * | 3/2005 | Uzawa | G03F 7/70525 355/30 |
| 7,047,816 | B2 * | 5/2006 | Jones | G01L 9/0039 73/729.1 |
| 7,320,252 | B2 * | 1/2008 | Jones | G01F 1/44 73/861.63 |
| 7,464,609 | B2 * | 12/2008 | Fallet | E21B 47/10 73/861.19 |
| 7,500,380 | B2 * | 3/2009 | Carter | G01L 19/0092 73/37.5 |
| 7,703,328 | B2 * | 4/2010 | DiFoggio | E21B 47/06 73/702 |
| 8,344,314 | B2 * | 1/2013 | Kramer | G01L 11/02 250/227.14 |
| 8,390,782 | B2 * | 3/2013 | Lyons | G03B 27/52 355/53 |
| 9,995,604 | B2 * | 6/2018 | Harpin | G01K 11/3206 |
| 10,082,437 | B2 * | 9/2018 | Duplain | G01L 9/0079 |
| 2001/0048084 | A1 * | 12/2001 | Uzawa | G03F 7/70525 250/492.22 |
| 2003/0020888 | A1 * | 1/2003 | Tanaka | G03F 7/70058 355/30 |
| 2004/0129083 | A1 * | 7/2004 | Fernald | G01L 11/025 73/705 |
| 2004/0182166 | A1 * | 9/2004 | Jones | G01L 9/0039 73/729.1 |
| 2005/0062979 | A1 | 3/2005 | Zhu et al. | |
| 2007/0151328 | A1 * | 7/2007 | Kochersperger | G01B 13/12 73/37.5 |
| 2008/0178686 | A1 * | 7/2008 | Jones | G01F 1/44 73/861.63 |
| 2010/0103399 | A1 * | 4/2010 | Lyons | G01B 13/00 355/71 |
| 2010/0108870 | A1 * | 5/2010 | Kramer | G01L 1/24 250/231.19 |
| 2012/0120380 | A1 | 5/2012 | Lyons | |
| 2014/0320832 | A1 * | 10/2014 | Sogard | G03F 7/7085 355/53 |
| 2016/0018280 | A1 * | 1/2016 | Hendricks | G01L 11/02 73/705 |

* cited by examiner

PROXIMITY SENSOR, LITHOGRAPHIC APPARATUS AND DEVICE MANUFACTURING METHOD

CROSS-REFERENCE TO RELATED APPLICATIONS

This application is the U.S. National Stage Application of International Patent Application No. PCT/EP2016/075670, filed on Oct. 25, 2016 which claims priority of EP application 15193776.0 which was filed on 10 Nov. 2015 and which is incorporated herein in its entirety by reference.

BACKGROUND

Field of the Invention

The present invention relates to a gas gauge proximity sensor, a lithographic apparatus and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. In order to accurately project or transfer the pattern onto a target portion of the substrate, various properties of the substrate to be exposed are measured. One of the properties that is determined is a so-called height map of the substrate, the height map providing insight in the actual height profile of the substrate. Knowledge of the actual height profile of the substrate, in particular the height profile of the target portions is needed to ensure that the substrate is positioned in or near a focal plane of the projection system during the exposure of the pattern onto the target portion. Typically, in order to assess the height profile of the substrate, a so-called level or sensor is used, such level sensor e.g. including a light source configured to provide a light beam onto a surface of a substrate; a detector configured to detect a reflection of the light beam from the surface of the substrate; and a processor configured to determine a position of the substrate on the basis of at least a detected reflection of the light beam from the surface of the substrate. Such a level sensor may also be referred to as an optical level sensor in that it makes use of an electromagnet beam (e.g. a light source with a comparatively wide frequency band) to measure a height level of the substrate. Such optical level sensors may suffer from a phenomenon known as apparent surface depression (ASD). When a measurement beam is projected onto a substrate, it may occur that part of the beam is not reflected off the top surface but enters the substrate whereupon it reflects on a more downward layer of the substrate. In such case, the detector of the optical level sensor may thus receive a combination of various reflected beams, not all of them originating from the top surface. Apparent surface depression thus results in an erroneous determination of the actual height level of the substrate. If this apparent surface depression were to be consistent, then it would be possible to calibrate the level sensor to account for this. However, it has been found that the apparent surface depression has a strong dependency upon the structure of the surface of the substrate. For example, a silicon wafer coated with photo-resist of a certain thickness and index of refraction will give rise to an apparent surface depression, whereas a substrate comprising a silicon wafer coated with a photo-resist of another thickness and/or index of refraction may give rise to an entirely different apparent surface depression. A substrate comprising a wafer coated with several layers of resist, thin films or structures can give rise to an entirely different apparent surface depression. An alternative to the use of an optical level sensor for determining a height of a substrate is the use of an air gauge proximity sensor, whereby a flow of gas is provided to a substrate and, based on a pressure or flow measurement, a height level may be determined. Such a sensor has the advantage of not relying on a reflection of an electromagnetic beam off the substrate, the aforementioned apparent surface depression error will not occur. However, known air gauge based proximity sensors suffer from the drawback that the measurement is rather slow. The measuring of an entire substrate surface height map would take too much time and as such, would adversely affect the productivity of the lithographic apparatus, i.e. the number of substrates that can be processed per unit of time. As such, such sensors are currently only used to calibrate an optical level sensor. It would however be advantageous to increase the measurement speed of an air gauge based proximity sensor, so as to either speed up the calibration process or to provide in an alternative to the use of an optical level sensor.

SUMMARY

It is desirable to provide in a gas gauge proximity sensor enabling a faster height measurement.

According to an embodiment of the invention, there is provided a gas gauge proximity sensor comprising:
a measurement gas flow channel having an measurement outlet configured to output a first gas flow towards a measurement object;
an optical pressure sensor for comparing a pressure of the first gas flow towards the measurement object and a reference pressure;
wherein:
   the optical pressure sensor comprises:
   a first optical cavity fluidly connected to the measurement channel;
   a second optical cavity fluidly connected to the reference pressure;
the first optical cavity is configured to receive an electromagnetic radiation and, in response, output a first reflected electromagnetic radiation;
the second optical cavity is configured to receive the electromagnetic radiation or a further electromagnetic radiation and, in response, output a second reflected electromagnetic radiation;

the optical pressure sensor is further configured to combine the first reflected electromagnetic radiation with the second reflected electromagnetic radiation and determine, based on the combined first reflected electromagnetic radiation and the second reflected electromagnetic radiation, a pressure difference between the pressure of the first gas flow and the reference pressure and determine, based on the pressure difference, a distance between the measurement outlet and the measurement object.

In another embodiment of the invention, there is provided a lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate, and a gas gauge proximity sensor according to the invention.

According to a further embodiment of the invention, there is provided a device manufacturing method comprising projecting a patterned beam of radiation onto a substrate, wherein the step of projecting a patterned beam of radiation is preceded by determining a height map of the substrate by means of a gas gauge proximity sensor according to the present invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
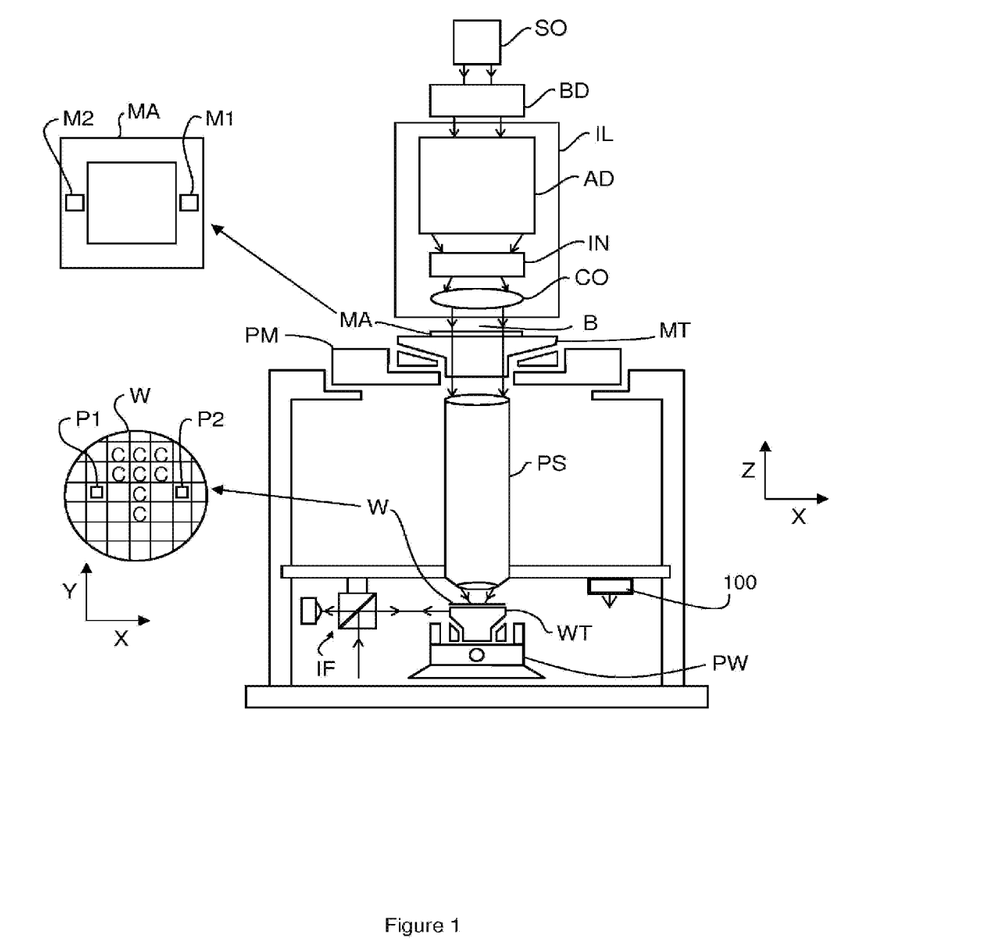
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

a. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

b. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

c. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Prior to the exposure process as described above, a so-called height map of the substrate is measured. Based on said height map, the positioning device PW can be controlled to position the substrate in such manner that the target portion that is exposed is within a focal range of the projection system PS. In order to generate such a height map, the lithographic apparatus may further comprise one or more gas gauge proximity sensors according to the present invention. FIG. 1 schematically shows a gas gauge proximity sensor 100. As will be explained in more detail below, the proximity sensor 100 is configured to provide a gas flow towards the surface to be measured and determine, based on a pressure measurement, the distance between an outlet of the proximity sensor and the surface. When this distance is determined at a plurality of locations on the substrate, such a set of measurements may be referred to as the height map of a substrate. When required, an interpolation algorithm or fitting algorithm may be applied to determine the height of the substrate at different locations than the measurement locations. During the measurement, the substrate W can e.g. be positioned underneath the proximity sensor 100, by appropriate control of the positioning device PW. In an embodiment, the lithographic apparatus may be equipped with a second substrate table and a second positioning device for positioning the second substrate table. In such arrangement, a substrate may undergo a measurement sequence, e.g. the measuring of a height map using a proximity sensor 100, while another substrate is being exposed.

Figure 2:
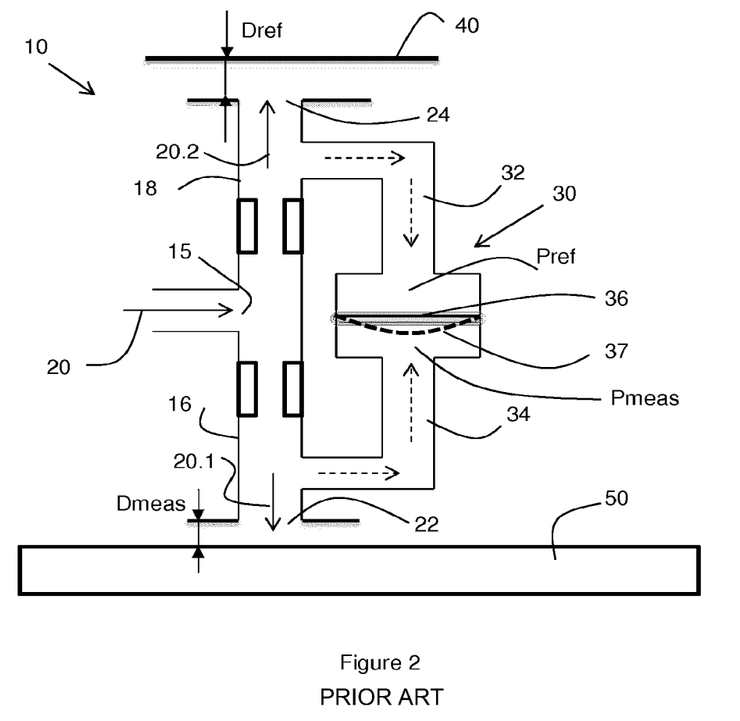
FIG. 2 depicts an air gauge proximity sensor as known in the art.

FIG. 2 schematically depicts an air gauge proximity sensor 10 as known in the art. The proximity sensor 10 has an inlet 15 which can e.g. be connected to a gas supply, e.g. a supply of air or Nitrogen, a measurement channel 16 and a reference channel 18. A gas flow 20 provided via the inlet is split into a first gas flow 20.1, through the measurement channel 16, towards a measurement nozzle or measurement outlet 22 of the measurement channel 16, and a second gas flow 20.2, through the reference channel 18, towards a reference nozzle or reference outlet 24 of the reference channel 18. The proximity sensor 10 further comprises a pressure sensor 30, i.e. a differential pressure sensor for measuring the pressure difference between the pressure in the measurement channel 16 and the reference channel 18. The pressure sensor 30 is fluidly connected to both the reference channel and the measurement channel, via conduits 32 and 34 and comprises a membrane 36 that is subjected, on one side, to the pressure Pmeas in the measurement channel 16 and, on an opposite side, to the pressure Pref in the reference channel 18. The proximity sensor 10 further comprises a reference object 40, e.g. a reference plate that is mounted at a fixed distance Dref from the reference outlet 24.

During operation, the proximity sensor 10 and a measurement object 50 are positioned relative to each other at an unknown distance Dmeas that is to be determined. When distance Dmeas equals the reference distance Dref, the pressure Pmeas will be substantially equal to the reference pressure Pref, i.e. the pressure in the reference channel 18, and the membrane 36 will not deflect. In case there is a pressure difference between Pmeas and Pref, the membrane 36 will deform, as e.g. indicated by the dotted line 37, the deflection of the membrane being a measure for the pressure difference and the pressure difference being indicative of the difference between the reference distance Dref and the unknown distance Dmeas. As such, based on a measurement of the deflection of the membrane 36, combined with the known distance Dref, Dmeas can be determined. Alternatively, the distance Dmeas can be determined by displacing the measurement object 50 relative to the proximity sensor 10 until the deflection of the membrane 36 is substantially zero.

A drawback of the known proximity sensor 10 is that it is rather slow to obtain a measurement result, as the measurement relies on a deformation of a membrane having a certain inertia and stiffness. Further, the membrane is a rather vulnerable component, prone to being damaged when no measures are taken to ensure that the pressure difference across the membrane is not too high.

In order to overcome this drawback, the gas gauge proximity sensor according to the present invention relies on a different measurement principle to determine a differential pressure.

In the present invention, use is made of an optical pressure sensor, the optical pressure sensor relying on the principle that a wavelength of a resonating electromagnetic wave (e.g. a light wave) inside a cavity depends on the pressure inside the cavity, the pressure determining the refractive index of the gas inside the cavity.

The optical pressure sensor as applied in the present invention includes two cavities, which may be referred to as optical cavities, resonator cavities or optical resonators. An optical cavity, resonating cavity or optical resonator is an arrangement of mirrors, i.e. at least partially reflecting surfaces that enable to form a standing wave of a particular resonance frequency when a light wave, in general an electromagnetic radiation wave, is applied to the cavity. Note that, within the meaning of the present invention, light should not be construed as being limited to visible light, rather, light is used to denote an electromagnetic wave that can be applied to the mentioned cavities to generate a standing wave inside the cavity. In general, light that is confined in a resonator will reflect multiple times from the mirrors, and due to the effects of interference, only certain patterns and frequencies of electromagnetic radiation will be sustained by the resonator, while others are being suppressed by destructive interference. Further, the frequencies that are sustained by the resonator depend on the pressure and thus on the refractive index, inside the cavity or resonator.

Figure 3:
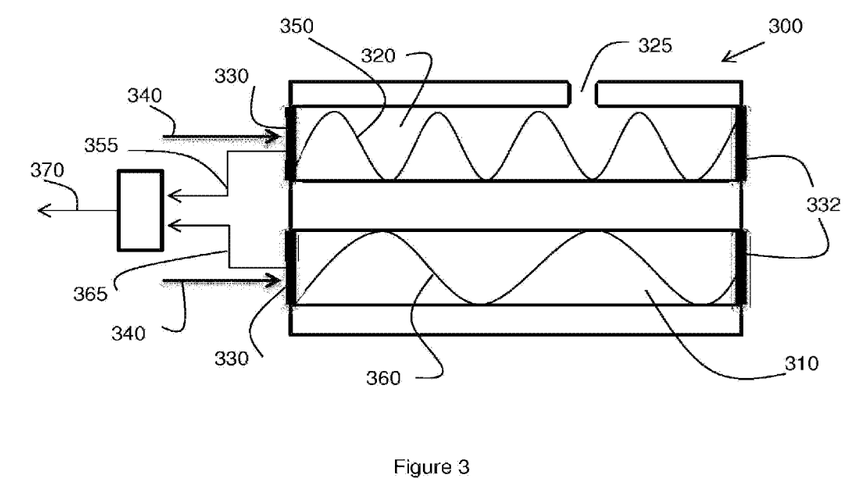
FIG. 3 schematically depicts the measurement principle as applied in an optical pressure sensor as applied in the present invention.

FIG. 3 schematically depicts the measurement principle as applied in the optical pressure sensor of the gas gauge proximity sensor according to the present invention. FIG. 3 schematically depicts a structure 300 provided with a first cavity 310 at a reference pressure Pref, e.g. an atmospheric pressure or vacuum pressure, and a second cavity 320 subjected to, or connected to, a measurement pressure Pmeas. In order to realize that the second cavity is at the measurement pressure Pmeas, a conduit 325 can be provided in the structure to connect the second cavity to the unknown measurement pressure Pmeas. Each cavity is provide with partially reflective optical components 330, 332 e.g. mirrors at opposing ends of the cavity, thus forming an optical cavity or optical resonator. When a light beam 340, in general electromagnetic radiation, is provided to the cavities, e.g. using a laser source, a standing wave of light having a particular resonance frequency will be generated in the cavities. In case the reference pressure Pref is different from the measurement pressure Pmeas, the standing wave 350 in the cavity 320 subjected to the measurement pressure Pmeas will have a wavelength different from the wavelength of the standing wave 360 in the cavity 310 that is subjected to the reference pressure Pref. These standing waves 350, 360 can be emitted by the cavities via the partially reflective components 330 and the emitted waves 355, 365 can be combined so as to form an interference pattern 370. This interference pattern may be provided to an optical detector such as a photodiode. It has been devised that a photodiode providing a signal proportional to the intensity of the interference pattern may be sufficient to determine the pressure difference. Alternatively however, a more advanced detector such as an image sensor, e.g. a CMOS or CCD image sensor may also be applied to track the interference pattern. Such an image sensor may also be applied to calibrate the optical pressure sensor. Based on the received interference pattern, the pressure difference between the reference pressure Pref and the measurement pressure Pmeas can be determined.

The above describe pressure measurement principle can be applied in a gas gauge proximity sensor in different ways.

Figure 4:
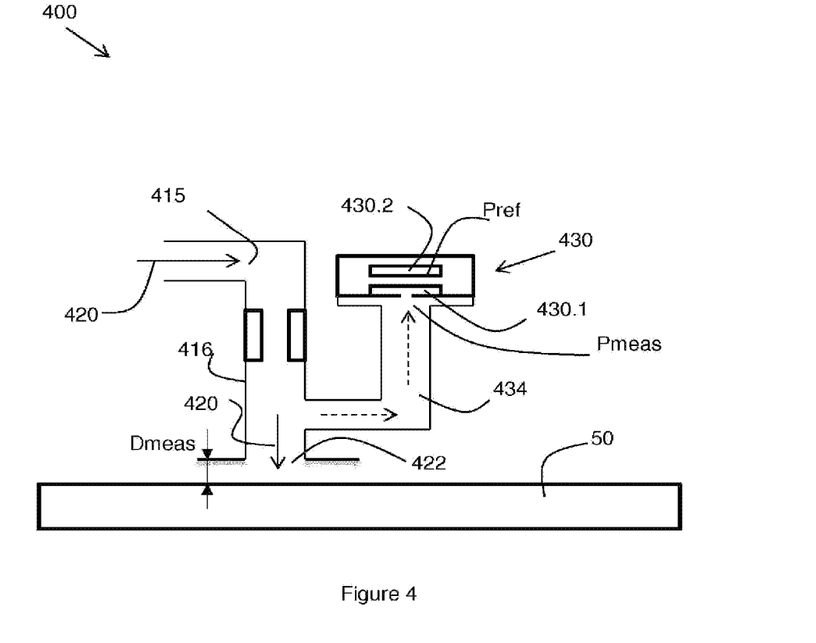
FIG. 4 depicts a first embodiment of an air gauge proximity sensor according to the present invention.

FIG. 4 schematically depicts a first embodiment of a gas gauge proximity sensor according to the present invention. FIG. 4 schematically shows an air gauge proximity sensor 400 comprising an inlet 415 configured to receive a gas flow 420, e.g. a flow of air, clean air or nitrogen, the flow of gas 420 being provided to a measurement channel 416 and outputted via an outlet 422 of the measurement channel 416. During use, the measurement outlet 422 is positioned at an unknown distance Dmeas from a measurement object 50 of which a height profile is to be determined. In order to determine the distance Dmeas, the pressure Pmeas is determined since this pressure is a measure for the distance Dmeas. The proximity sensor 400 according to the first embodiment of the present invention further comprises an optical pressure sensor 430 including a first cavity 430.1 in fluid communication with the measurement channel 416, via a conduit 434 and a second cavity 430.2 at a reference pressure Pref. As such, the first cavity 430.1 is subjected to the measurement pressure Pmeas. The optical cavities 430.1 and 430.2 are further configured to receive an electromagnetic radiation, e.g. a light wave emitted by a laser or laser diode and emit a reflected electromagnetic radiation, i.e. a wave reflected in the cavities. In such arrangement, the optical cavity 430.1 may be configured to receive an electromagnetic radiation, the optical cavity 430.2 receiving the same electromagnetic radiation or a further electromagnetic radiation. Both cavities may thus be provided with electromagnetic radiation originating from the same source, e.g. a light source such as a laser. In an embodiment, see further on, the cavities may sequentially be provided with electromagnetic radiation, whereby an electromagnetic radiation that is outputted by a first of the two cavities is used as an input electromagnetic radiation for the second of the two cavities. As explained with reference to FIG. 3, the wavelengths of the reflected electromagnetic radiations that are emitted by the respective cavities depend on the respective pressures in the cavities. The optical pressure sensor 430 as schematically shown in FIG. 4 is further configured to combine the reflected electromagnetic radiation from the first cavity 430.1 with the reflected electromagnetic radiation from the second cavity 430.2 and determine, based on the combined electromagnetic radiation, a pressure difference between the pressure Pmeas towards the measurement object and the reference pressure Pref and determine, based on the pressure difference, a distance Dmeas between the measurement outlet 422 of the measurement channel 416 and the measurement object 50. In an embodiment, the optical pressure sensor 430 may comprise an optical detector such as a photo-diode or an image sensor such as a CMOS or CCD image sensor to receive the combined signal and a processing unit, e.g. a microprocessor or the like for processing a detector signal received from the optical detector, the detector signal being representative of the combined signal as received by the optical detector. Based on the pressure difference as determined from the combined signal, the distance Dmeas between the measurement outlet 422 of the measurement channel 416 and the measurement object 50 can be determined, e.g. by a processing unit of the optical pressure sensor.

Figure 5:
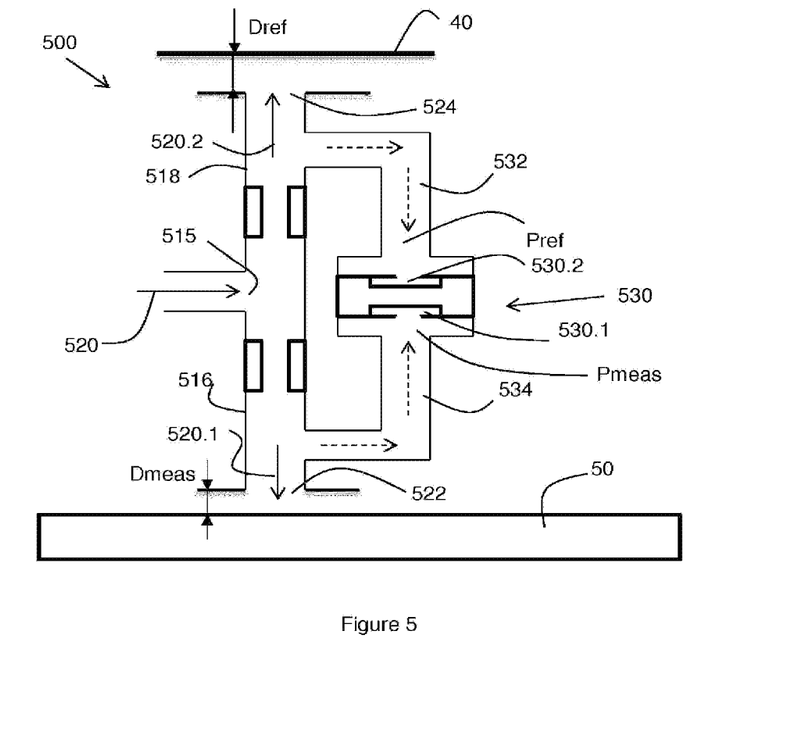
FIG. 5 depicts a second embodiment of an air gauge proximity sensor according to the present invention.

FIG. 5 schematically depicts a second embodiment of a gas gauge proximity sensor according to the present invention. Compared to the first embodiment of FIG. 4, the second optical cavity of the optical pressure sensor is not closed but is fluidly connected to a reference channel through which a second gas flow flows, towards a reference object 40. The gas gauge proximity sensor 500 according to the present invention has an inlet 515 which can e.g. be connected to a gas supply, e.g. a supply of air or nitrogen. The gas gauge proximity sensor 500 further has a measurement gas flow channel 516 and a reference gas flow channel 518. A gas flow 520 provided via the inlet is split into a first gas flow 520.1 and a second gas flow 520.2. The first gas flow 520.1 is through the measurement gas flow channel 516, towards a measurement nozzle or measurement outlet 522 of the measurement gas flow channel 516. The second gas flow 520.2 is through the reference gas flow channel 518, towards a reference nozzle or reference outlet 524 of the reference gas flow channel 518. The proximity sensor 500 further comprises an optical pressure sensor 530, applying the measurement principle as explained above with reference to FIG. 3. The optical pressure sensor 530 is a differential pressure sensor configured to determine the pressure difference between the measurement gas flow channel 516 and the reference gas flow channel 518. The optical pressure sensor 530 is fluidly connected to both the reference gas flow channel 518 and the measurement gas flow channel, via conduits 532 and 534, respectively. The optical pressure sensor 530 includes a first cavity 530.1 via a conduit 534 in fluid communication with the measurement gas flow channel 516, and a second cavity 530.2 via a conduit 532 in fluid communication with the reference gas flow channel 516. As such, the first cavity 530.1 is subjected to the measurement pressure Pmeas, i.e. a pressure at or near the measurement outlet 522, whereas the second cavity 530.2 is subjected to the reference pressure Pref, i.e. a pressure at or near the reference outlet 524. The optical cavities 530.1 and 530.2 are further configured to receive an electromagnetic radiation, e.g. a light wave emitted by a laser or laser diode and emit a reflected electromagnetic radiation, i.e. a electromagnetic radiation reflected in the cavities. During operation, the proximity sensor 510 and a measurement object 50 are positioned relative to each other at an unknown distance Dmeas that is to be determined. The optical pressure sensor 530 as schematically shown in FIG. 5 is further configured to combine the reflected electromagnetic radiation from the first cavity 530.1 with the reflected electromagnetic radiation from the second cavity 530.2 and determine, based on the combined electromagnetic radiation, a pressure difference between the pressure Pmeas towards the measurement object and the reference pressure Pref towards the reference object and determine, based on the pressure difference, a distance Dmeas between the measurement outlet 522 of the measurement gas flow channel 516 and the measurement object 50.

Compared to the first embodiment of FIG. 4, the optical pressure sensor 530 as schematically shown in FIG. 5 has both optical cavities 530.1 and 530.2 open. Such an arrangement has as an advantage that the effects of common disturbance sources are at least partly cancelled out. As will be understood by the skilled person, in case there is a fluctuation in the gas supply 520 towards the measurement gas flow channel and in the reference gas flow channel, this fluctuation will affect both the reference pressure Pref and the measurement pressure Pmeas. Because the optical pressure sensor 530 determines the pressure difference between the reference pressure Pref and the measurement pressure Pmeas, the effect of the fluctuation is at least partially cancelled.

Figure 6:
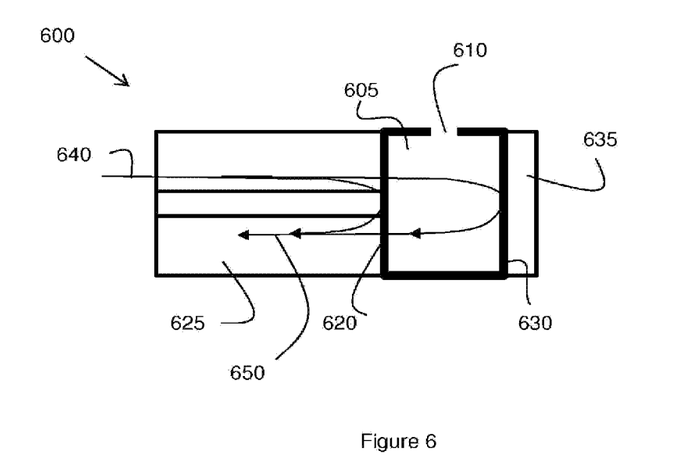
FIG. 6 depicts a first embodiment of a sensing unit as can be applied in an optical pressure sensor.
Figure 7:
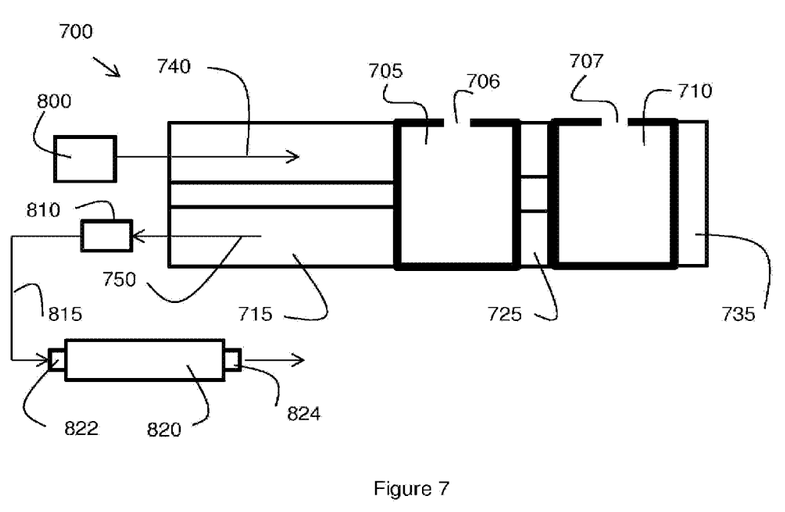
FIG. 7 depicts a second embodiment of a sensing unit as can be applied in an optical pressure sensor.

FIGS. 6 and 7 schematically depict some more details of how the optical cavities or optical resonators may be realized.

FIG. 6 schematically depicts a sensing unit 600 comprising an optical cavity 605 having an opening 610 which can be connected to a pressure to be determined, e.g. a reference pressure Pref or measurement pressure Pmeas as available in the gas gauge proximity sensors as shown in FIGS. 4 and 5. Such an optical cavity can be formed by a silica capillary tube 605 or by a hollow core fiber. Such a silica capillary tube 605 may further be bonded, e.g. fusion bonded on both sides 620, 630 to optical fibers 625, 635. On one side, 620, the fiber 625 as applied can be configured to receive an electromagnetic radiation 640 and provided it to the cavity 605 and to output a reflected electromagnetic radiation, a signal reflected inside the cavity, as indicated by the arrow 650, e.g. towards an optical detector, e.g. a photodiode. Fiber 635 may e.g. be cleaved and act as a reflective mirror. In an embodiment, a diameter of the optical fiber 625 is about 125 µm, and a length of the optical cavity 605 that determines the standing wave is about 20 µm.

The structure as shown in FIG. 6 can be considered a sensing unit for sensing a pressure of a gas inside the cavity. A optical pressure sensor as e.g. applied in FIGS. 4 and 5 can be constructed using two such units, one to sense a reference pressure Pref (either using an open cavity, open to a reference pressure or using a closed cavity, containing a reference pressure) and one to sense a measurement pressure Pmeas as indicated in FIGS. 4 and 5. It should be noted that such sensing units may be positioned on different locations, e.g. one unit close to the reference outlet 524 and one unit close to the measurement outlet 522 of FIG. 5.

In an embodiment, the optical sensing of both the reference pressure Pref and the measurement pressure Pmeas may be combined. FIG. 7 schematically depicts an arrangement 700 of two optical cavities 705, 710 that are combined and may be connected to a reference pressure Pref and a measurement pressure Pmeas via openings 706, 707. The optical cavities 705, 710 are arranged along the same optical path and are bonded, on both sides by optical fibers 715, 725 and 735. In the arrangement as shown, an electromagnetic radiation 740 may be provided, via optical fiber 715, to the first optical cavity 705. Part of the electromagnetic radiation may be reflected back to the fiber 715, after being reflected inside the cavity 705, whereas another part of the electromagnetic radiation is received by the second cavity 710, where it may reflect and outputted towards the optical fiber 715. The reflected electromagnetic radiation 750 that is outputted by the optical fiber 715 thus already combines electromagnetic radiations that are reflected in the first and second cavities 705 and 710. This reflected electromagnetic radiation 750 may thus readily be provided to an optical detector such as a photodiode and processed to determine a difference between the pressure as applied in the first cavity 705 and a pressure as applied in the second cavity 710.

The arrangement 700 as shown may e.g. be applied in an optical pressure sensor of a gas gauge proximity sensor according to the present invention. In such case, one of the cavities, e.g. cavity 705 may be fluidly connected to a reference pressure Pref while to other one of the cavities, e.g. cavity 710 is fluidly connected to a measurement pressure Pmeas.

FIG. 7 further schematically shows a light source 800 as can be applied in a gas gauge proximity sensor according to the present invention to provide an electromagnetic radiation to an optical cavity of the optical pressure sensor, in particular the electromagnetic radiation 740 to the optical fiber 715. FIG. 7 further shows a detector 810 as can be applied to receive the reflected electromagnetic radiation from an optical cavity of the optical pressure sensor as applied, in particular the optical fiber 715. The detector 810 as shown in figure configured to provide, in response to the received reflected electromagnetic radiation, a detector output signal 815 to a processing unit 820, in particular to an input terminal 822 of the processing unit 820. In accordance with the present invention, such a processing unit may be implemented as a microprocessor, a microcontroller or the like, e.g. comprising a memory unit for storing data and a computational unit for processing data. In accordance with an embodiment of the present invention, the processing unit of the gas gauge proximity sensor is configured to receive the detector signal 815 and process the signal, in order to determine the pressure difference between the pressures Pref and Pmeas and, based on this pressure difference, determining the distance Dmeas between the measurement object 50 and the measurement outlet of the proximity sensor as e.g. shown in FIGS. 4 and 5. As will be clear to the skilled person, the light source 800, detector 810 and processing unit 820 as schematically shown in FIG. 7 may be applied to provide electromagnetic radiation and process reflected electromagnetic radiations to any of the optical pressure sensors or optical cavities as described above.

In an embodiment, a plurality of gas gauge proximity sensors according to the present invention can be combined into an array of sensors that is configured to perform a plurality of measurements in parallel, at different locations on the measurement object. In such an arrangement, two or more gas gauge proximity sensors of the array of sensors may share a sensing unit sensing a reference pressure Pref.

Because of the use of an optical pressure sensor, a determination of the distance Dmeas as shown in FIGS. 4 and 5 can be made much faster, enabling to determine a height or height profile of a substrate, as the measurement object, much faster.

Acoustic noise may affect the pressure variations as measured by the gas gauge proximity sensor. However, the acoustic noise may be filtered out via a frequency analysis of the eventual output signal of the optical detector.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV)

radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. Apparatus comprising:
   a measurement gas flow channel having a measurement outlet, the measurement gas flow channel being configured to output a first gas flow towards a measurement object; and
   an optical pressure sensor for comparing a pressure of the first gas flow towards the measurement object with a reference pressure, the optical pressure sensor comprising a first optical cavity fluidly connected to the measurement channel and a second optical cavity fluidly connected to the reference pressure, the first optical cavity being configured to output first reflected electromagnetic radiation and the second optical cavity being configured to output second reflected electromagnetic radiation, the optical pressure sensor being further configured to combine the first reflected electromagnetic radiation with the second reflected electromagnetic radiation and determine, based on the combined first reflected electromagnetic radiation and the second reflected electromagnetic radiation, a pressure difference between the pressure of the first gas flow and the reference pressure and determine, based on the pressure difference, a distance between the measurement outlet and the measurement object.

2. Apparatus as claimed in claim 1 further comprising a reference gas flow channel configured to provide the reference pressure; the reference channel comprising an reference outlet configured to output a second gas flow towards a reference object, a pressure of the second gas flow corresponding to the reference pressure and wherein the second cavity is fluidly connected to the reference gas flow channel.

3. Apparatus as claimed in claim 2 wherein the measurement gas flow channel and the reference gas flow channel have a common inlet configured to be connected to a gas supply for supplying the first gas flow to the measurement gas flow channel and a second gas flow to the reference gas flow channel.

4. Apparatus as claimed in claim 1 wherein at least one of the first optical cavity and the second optical cavity is integrated in an optical fiber.

5. Apparatus as claimed in claim 1 wherein at least one of the first optical cavity and the second optical cavity comprises a pair of mirror surfaces.

6. Apparatus as claimed in claim 5 wherein the at least one of the first optical cavity and the second optical cavity comprise a silica tube.

7. Apparatus as claimed in claim 6 wherein an optical fiber portion is mounted to each of the mirror surfaces.

8. Apparatus as claimed in claim 6 wherein the pair of mirror surfaces comprises at least one partially reflective mirror surface.

9. Apparatus as claimed in claim 5 wherein an optical fiber portion is mounted to each of the mirror surfaces.

10. Apparatus as claimed in claim 5 wherein the pair of mirror surfaces comprises at least one partially reflective mirror surface.

11. Apparatus as claimed in claim 1 wherein the first optical cavity and the second optical cavity are optically arranged in series.

12. Apparatus as claimed in claim 1 further comprising a source configured to provide electromagnetic radiation to the optical cavities.

13. Apparatus as claimed in claim 12 wherein the source comprises a light source configured to provide the electromagnetic radiation in the form of a light beam.

14. Apparatus as claimed in claim 13 wherein the light beam comprises a laser beam.

15. Apparatus comprising an array of gas gauge level sensors each comprising:
    a measurement gas flow channel having a measurement outlet, the measurement gas flow channel being configured to output a first gas flow towards a measurement object; and
    an optical pressure sensor for comparing a pressure of the first gas flow towards the measurement object with a reference pressure, the optical pressure sensor comprising a first optical cavity fluidly connected to the measurement channel and a second optical cavity fluidly connected to the reference pressure, the first optical cavity being configured to output first reflected electromagnetic radiation and the second optical cavity being configured to output second reflected electromagnetic radiation, the optical pressure sensor being further configured to combine the first reflected electromagnetic radiation with the second reflected electromagnetic radiation and determine, based on the combined first reflected electromagnetic radiation and the second reflected electromagnetic radiation, a pressure difference between the pressure of the first gas flow and the reference pressure and determine, based on the pressure difference, a distance between the measurement outlet and the measurement object, wherein the second optical cavities of the gas gauge level sensors in the array are fluidly connected to a common reference pressure.

16. A lithographic apparatus comprising:
    an illumination system configured to condition a radiation beam;
    a support constructed to support a patterning device, the patterning device being adapted to impart a pattern to a cross-section of the radiation beam to form a patterned radiation beam;
    a substrate table constructed to hold a substrate;
    a projection system configured to project the patterned radiation beam onto a target portion of the substrate; and
    a gas gauge proximity sensor comprising a measurement gas flow channel having a measurement outlet, the measurement gas flow channel being configured to output a first gas flow towards the substrate and an optical pressure sensor for comparing a pressure of the first gas flow towards the substrate with a reference pressure, the optical pressure sensor comprising a first optical cavity fluidly connected to the measurement channel and a second optical cavity fluidly connected to the reference pressure, the first optical cavity being configured to output first reflected electromagnetic radiation and the second optical cavity being configured to output second reflected electromagnetic radiation, the optical pressure sensor being further configured to combine the first reflected electromagnetic radiation with the second reflected electromagnetic radiation and determine, based on the combined first reflected electromagnetic radiation and the second reflected electromagnetic radiation, a pressure difference between the pressure of the first gas flow and the reference pressure and determine, based on the pressure difference, a distance between the measurement outlet and the substrate.

17. Apparatus as claimed in claim 16 further comprising a reference gas flow channel configured to provide the reference pressure; the reference channel comprising an reference outlet configured to output a second gas flow towards a reference object, a pressure of the second gas flow corresponding to the reference pressure and wherein the second cavity is fluidly connected to the reference gas flow channel.

18. Apparatus as claimed in claim 16 wherein the measurement gas flow channel and the reference gas flow channel have a common inlet configured to be connected to a gas supply for supplying the first gas flow to the measurement gas flow channel and a second gas flow to the reference gas flow channel.

19. Apparatus as claimed in claim 16 wherein at least one of the first optical cavity and the second optical cavity is integrated in an optical fiber.

20. A method comprising the steps of:
determining a height map of the substrate using an optical pressure sensor to compare a pressure of a first gas flow towards the substrate with a reference pressure, the optical pressure sensor comprising a first optical cavity fluidly connected to the measurement channel and a second optical cavity fluidly connected to the reference pressure, the first optical cavity being configured to output first reflected electromagnetic radiation and the second optical cavity being configured to output second reflected electromagnetic radiation, the optical pressure sensor being further configured to combine the first reflected electromagnetic radiation with the second reflected electromagnetic radiation and determine, based on the combined first reflected electromagnetic radiation and the second reflected electromagnetic radiation, a pressure difference between the pressure of the first gas flow and the reference pressure and determine, based on the pressure difference, a distance between the measurement outlet and the substrate, the height map being based at least in part on the determined distance between the measurement outlet and the substrate; and projecting a patterned beam of radiation onto a substrate based at least in art on the height map.

* * * * *

UNITED STATES PATENT AND TRADEMARK OFFICE
CERTIFICATE OF CORRECTION

PATENT NO. : 10,551,182 B2  
APPLICATION NO. : 15/769999  
DATED : February 4, 2020  
INVENTOR(S) : Guan et al.

Page 1 of 1

It is certified that error appears in the above-identified patent and that said Letters Patent is hereby corrected as shown below:

In the Claims

In Column 13, Line 48, Claim 2 please replace "comprising an" with --comprising a--.

In Column 15, Line 18, Claim 17 please replace "comprising an" with --comprising a--.

In Column 16, Line 28, Claim 20 please replace "in art" with --in part--.

Signed and Sealed this  
Twelfth Day of May, 2020

Andrei Iancu  
*Director of the United States Patent and Trademark Office*